(12) United States Patent
Petrofsky

(10) Patent No.: US 7,969,189 B2
(45) Date of Patent: Jun. 28, 2011

(54) METHOD AND SYSTEM FOR IMPROVED PHASE NOISE IN A BICMOS CLOCK DRIVER

(75) Inventor: Joseph Gerard Petrofsky, Nevada City, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 12/624,854

(22) Filed: Nov. 24, 2009

(65) Prior Publication Data

US 2011/0121859 A1    May 26, 2011

(51) Int. Cl.
*H03K 19/094* (2006.01)
(52) U.S. Cl. ............... 326/66; 326/28; 326/73; 326/77; 326/115; 327/491
(58) Field of Classification Search ............... 326/21–28, 326/66, 73, 77, 115; 327/491
See application file for complete search history.

(56) References Cited

U.S. PATENT DOCUMENTS

| | | | | |
|---|---|---|---|---|
| 4,437,171 A * | 3/1984 | Hudson et al. | ............... | 365/177 |
| 4,754,171 A * | 6/1988 | Dasai et al. | ............... | 326/126 |
| 5,019,726 A | 5/1991 | Guo | | |
| 5,216,298 A * | 6/1993 | Ohba et al. | ............... | 326/64 |
| 5,225,717 A * | 7/1993 | Shiomi et al. | ............... | 326/66 |
| 5,255,225 A * | 10/1993 | Nambu et al. | ............... | 365/189.11 |
| 5,287,019 A * | 2/1994 | Nonaka et al. | ............... | 326/66 |
| 5,434,518 A * | 7/1995 | Sinh et al. | ............... | 326/66 |
| 5,459,412 A * | 10/1995 | Mentzer | ............... | 326/66 |
| 5,463,345 A * | 10/1995 | Nagahori et al. | ............... | 327/374 |
| 5,631,580 A | 5/1997 | Rau | | |
| 5,652,545 A * | 7/1997 | Miyashita et al. | ............... | 330/269 |
| 5,754,059 A * | 5/1998 | Tanghe et al. | ............... | 326/77 |
| 5,767,702 A * | 6/1998 | Hense et al. | ............... | 326/126 |
| 5,900,746 A | 5/1999 | Sheahan | | |
| 6,008,667 A | 12/1999 | Fahrenbruch | | |
| 6,366,140 B1 * | 4/2002 | Warwar | ............... | 327/108 |
| 6,380,808 B1 * | 4/2002 | Uasa et al. | ............... | 330/263 |
| 6,490,301 B1 * | 12/2002 | Tatehara et al. | ............... | 372/33 |
| 6,552,577 B1 * | 4/2003 | Tam | ............... | 326/126 |
| 7,345,528 B2 | 3/2008 | Zanchi et al. | | |
| 2004/0246026 A1 | 12/2004 | Wang et al. | | |
| 2009/0066399 A1 | 3/2009 | Chen et al. | | |
| 2009/0302890 A1 * | 12/2009 | Escobar-Bowser et al. | .... | 326/66 |

FOREIGN PATENT DOCUMENTS

| EP | 0 501 085 A1 | 9/1992 |
|---|---|---|
| WO | WO 03/043191 A2 | 5/2003 |

OTHER PUBLICATIONS

European Search Report issued in European Patent Application No. EP 10014953.3 dated Feb. 4, 2011.

* cited by examiner

*Primary Examiner* — Jason M Crawford
(74) *Attorney, Agent, or Firm* — McDermott Will & Emery LLP

(57) ABSTRACT

System and method for a clock driver. An input taking circuit is used for receiving small-signal logic inputs. A voltage follower circuit is coupled to the input taking circuit and used to generate a set of voltage follower outputs. An output circuit is coupled to the voltage follower circuit to receive the set of voltage follower outputs as inputs and generate output signals. The voltage follower circuit is coupled to a switching circuit, that is connected to the set of voltage follower outputs and is deployed for reducing the phase noise level of the output signals.

44 Claims, 6 Drawing Sheets

METHOD AND SYSTEM FOR IMPROVED PHASE NOISE IN A BICMOS CLOCK DRIVER

BACKGROUND

1. Technical Field

The present teaching relates to a method and system for clock driver and systems incorporating the same. More specifically, the present teaching relates to a method and system for a BiCMOS clock driver and systems incorporating the same.

2. Discussion of Technical Background

Modern signal processing systems frequently digitize and process high speed signals that have a wide dynamic range. Digitization includes both quantizing a signal into discrete levels, e.g., into $2^n$ levels, in an n-bit Analog-to-Digital converter (ADC), as well as sampling a signal at discrete time intervals. Some high speed input signals are at a frequency higher than the sampling rate of the ADC used. This yields a condition called under-sampling, under which a precise repetitive time-based reference is needed. Otherwise, the uncertainty in the timing of the sampling operation may create errors that are larger than that created in a quantizing process. This well known problem is documented in the Background section of U.S. Pat. No. 7,345,528 (hereafter "the '528 patent"), entitled "Method and Apparatus for Improved Clock PreAmplifier with Low Jitter".

An ideal clock signal for such a system is a repetitive waveform with a perfectly uniform period. Every single cycle should have exactly the same duration as that of all other cycles. The fluctuations in actual clock signals with respect to the durations of each period can be characterized, as jitter (in time domain) or phase noise (in frequency domain). The latter can be converted to the former with certain assumptions. It is commonly recognized that the lower the jitter or phase noise, the more desirable it is.

To achieve a lower phase noise, different attempts have been made. For example, low noise Bipolar Junction Transistor (BJT) circuits can be made in the form of, e.g., Emitter-Coupled Logic (ECL), to achieve sufficiently low phase noise. A BJT circuit preserves the signal speed and noise integrity at low amplitudes.

Conventional CMOS logic circuits may also be used to achieve low phase noise, despite the higher inherent noise in MOSFET devices, due to the fact that the logic swings are large (rail-to-rail) and phase noise is a Signal-to-Noise characteristic. That is, larger noises may be overcome by using higher rail-to-rail signal levels.

CMOS can preserve both speed and noise only if a rail to rail signal swing can be obtained. However, hardly any signal sources for low-phase noise signals, whether a quartz crystal oscillator, a resonant oscillator, or a carrier transmitting a signal through a medium, can deliver true rail-to-rail CMOS logic levels. Therefore, a problem arises when translating a low-phase noise signal from low-levels such as ECL or a small sinusoid waveform to CMOS logic levels.

There are various prior solutions for translating a low-phase noise signal from low levels to CMOS logic levels. Unfortunately, such prior solutions have generally yielded poor phase noise, limited speed, excessive usage of power, or combinations thereof. For instance, a conversion circuit disclosed in U.S. Pat. No. 5,019,726 (hereafter "the '726 patent"), entitled "BiCMOS ECL-TO-CMOS Conversion Circuit," is driven, at the inputs, by differential ECL signals with a circuit load of three MOSFET gates. The capacitive loading of MOSFET gates in the '726 patent either limits the speed at which a circuit can operate, or requires substantial power to drive the gates. Depending on the implementation, the solution proposed by the '726 patent may increase the noise level. In addition, the base node of the upper BJTs has to cycle through a large voltage swing in each cycle. Thus, when combined with the inevitable slew-rate limitations, it creates timing uncertainties. When the current that is used to charge the capacitance of that base node, which is set either by the upper PMOS or the lowest NMOS, is noisy, the phase noise degrades proportionally with respect to the noise level. The time to produce a voltage swing from an idle state to a cross-over point is also inversely proportional to the slew rate.

Another prior solution is disclosed in U.S. Pat. No. 5,631,580 (hereafter "the '580 patent"), entitled "BiCMOS ECL-to-CMOS Level Converter," which has low-level signal swings until a rail-to-rail CMOS signal is created. However, the performance of the circuit disclosed therein still can not produce desired phase noise performance because the noise level yielded from the PMOSFET (having its gate connected to its drain) is still too high. This limits the available voltage swing, which subsequently degrades the signal to noise ratio. Even without this limitation, the base of the complementary output BJTs is driven all the way to their emitters, to the rail, when that BJT is off. This represents a signal swing of many hundreds of milliVolts (as much as 900 mV at −55° C.) from an idle state to a cross-over point. Although the '580 patent represents an improvement over the '726 patent, the noise is still too large and leads to degradation of phase noise because of the current noise and the slew rate limiting that occurs.

In U.S. Pat. No. 5,900,746 (hereafter "the '746 patent), entitled "Ultra Low Jitter Differential to Fullswing BiCMOS Comparator with equal rise/fall time and Complementary Outputs," the inputs to the first CMOS gate are held at a static level near the threshold of crossover using a dummy inverter and the dynamic drive signal is a low-level signal from BJT differential pairs. Thus, the first nodes with a significant change in voltage to be slewed are the first rail-to-rail CMOS signals. However, the signals that drive the gates of the first MOSFETs are inherently current driven signals. Because of that, the slew rate of the edges are set by the quiescent current levels in the driving circuitry as well as the capacitance looking into the gates of the MOSFETs in the inverters. Those capacitances include gate to source capacitance, gate to bulk capacitance, and gate to drain capacitance. Thus, the latter term is effectively multiplied several times in accordance with the well-known Miller effect, which drives up the effective capacitance because of the opposite plate being connected to the drain. That is, the inverter output has a large and opposing voltage swing.

Driving the gates with such current sources may result in acceptable speeds, but noise performance often suffers because of the noise present in the current sources. On-chip current sources are usually created with the well-known band-gap type reference, providing a current that can be largely independent of supply voltage and temperature, or proportional to the absolute temperature. Although the circuitry disclosed in the '746 patent provides some desirable features in some cases, the dynamic range of a current source based on a band-gap reference, which is defined as the quiescent current level divided by the current noise level, is often a limitation in achieving the most demanding phase noise performance.

Another prior art circuit is disclosed in U.S. Pat. No. 6,008,667 (hereafter "the '667 patent"), entitled "Emitter-Coupled Logic to CMOS Logic Converter and method of operation." In the circuit described in the '667 patent, the gates of the N-MOS and P-MOS transistors that create the first rail-to-rail CMOS signal are independently driven with a small voltage swing centered around the threshold Vgs of each respective MOSFET. This improves the speed for a given level of quiescent current drain, as measured in terms of both propagation delay and the slew rate of the gate drive signals. One of the noise sources of the inverter MOSFETs is the input referred voltage noise. Thus, the faster the slew rate in volts per second, the less voltage noise is converted into phase noise.

The circuit disclosed in the '667 patent, however, also suffers from two shortcomings already identified in other prior art circuits. The first is that the gate driven signals are still limited by the quiescent currents in the stage. The gate-to-drain connected MOSFETs at the inverter gate nodes attempt to lower the impedance, making the driver more like a voltage source. Thus, as passive devices, such MOSFETs do not increase the current available to drive the inverter gate terminals. The second limitation is that the gate-to-drain connection of those MOSFETs inherently limits the signal to noise ratio, as previously discussed.

The circuit disclosed in U.S. Pat. No. 7,345,528 (hereafter "the '528 patent") drives the gates of the first inverter with a common node held at the appropriate mid-supply level (which can be seen also in the circuit disclosed in the '746 patent). In the '528 patent, the driver circuitry includes complementary differential BJT pairs to improve the signal to noise ratio for a given quiescent current level. The circuit as disclosed in the '528 patent, drives the inverter inputs with signals that are high impedance but, by varying both the current sink and the current source driving those nodes, the signal to noise level is improved by a factor of two. In addition, the '528 patent discloses a bipolar clamp circuit that limits the voltage swing at the inverter inputs, which may improve the phase noise performance as mentioned above.

FIG. 1 (PRIOR ART) shows another prior art circuit for driving the gate terminals of a pair of P-MOSFETs (150 and 155) from a conventional ECL logic gate including transistors 115 and 120. When fabricated using an integrated circuit process with reasonable control of the Vbe level of an NPN transistor and the Vgs threshold level of a PMOS transistor (150 or 155), this circuit can be made, based on skills well known in the art, to function properly for all operating temperatures with appropriate setting of the voltage swing. The inputs to the circuit are ECL logic signals and the outputs are usable for creating CMOS logic signals, as will be explained below.

As a digital logic circuit, FIG. 1 has only two static states, with the transitions between the two states occurring in (hopefully) quick dynamic events. When the input state changes, one of the two PMOS devices (e.g., 150) is turned off by the NPN emitter follower (e.g., 130) connected to its gate. This usually happens quite quickly and with low noise, because the NPN emitter follower (e.g., 130) acts as a voltage source, increasing the current needed to pull the node up in tandem with the signal on its base due to the current gain of the device. However, in the other half of the circuit, the other PMOS device (e.g., 155) will be turned on, but this will not happen as quickly because the emitter follower (e.g., 135) will cut-off (drop to zero emitter current) unless the quiescent bias current (145) of the emitter follower is set to a very high level. The capacitance looking into the gate of the MOSFET, as noted above, includes gate to source capacitance, gate to bulk capacitance, and gate to drain capacitance, where the latter term is effectively multiplied several times by the well-known Miller effect.

Given such multiplied capacitance as well as the fast slew-rate that an ECL logic gate can create, a substantial quiescent current is needed to keep the NPN emitter follower (e.g., 135) actively biased during the falling edge of the signal. This substantial bias level has all the usual undesirable outcomes, including increased power consumption from the supply rails, increased heat generation on the chip. It also causes an increase of the noise in the circuit because the base current noise of the NPN works into the pull-up resistor, R4 (110) which is substantially larger than the reciprocal of the transconductance (gm). That is, the voltage noise level at the base terminal is not set by the usual voltage noise terms, but rather by the current noise times the value of the pull-up resistor.

With a typical quiescent current level, the noise can be kept quite reasonable on the edge that turns off the PMOS device. However, the time base noise is dominated by the noise of the current source on the edge that turns on the PMOS device.

An alternative to the Prior Art of FIG. 1 is to change transistors Q5 and Q6 to N-channel MOSFETs. These source followers will act the same as the emitter followers described above as they are both functionally a type of voltage follower. The use of NMOS could introduce problems associated with the $Vgs_{(ON)}$ variability, particularly due to the bulk effect whereby the $Vgs_{(ON)}$ changes as a function on bulk voltage. But the dominant noise term using emitter followers, base current shot noise, is eliminated since the gate current noise of a MOSFET is orders of magnitude less. So with NMOS based voltage followers, it may be possible to increase the currents from I2 & I3 without as much noise penalty for doing so as with an NPN based voltage follower.

FIG. 2 (PRIOR ART) shows one prior art solution 200 to create conventional CMOS logic signals for the circuit as shown in FIG. 1. In circuit 200, anti-parallel CMOS inverters 230 and 240 are placed on the drains of the PMOS transistors 210 and 220, forming a latch which is set and reset between two logic states in association with circuit 100 in FIG. 1. This is an appropriate implementation in a CMOS process that includes NPN but not PNP BJTs. However, circuit 200 will result in a slight skew of the duty cycle at both outputs. One of the PMOS devices 210 and 220 generally turns off faster than the speed that its counterpart PMOS turns on, as discussed above with reference to FIG. 1. This is desirable from the standpoint of contention in circuit 200 shown in FIG. 2. However, the skew occurs at the outputs due to the fact that the rising edge of either output is actively pulled by the PMOS devices and the falling edge will lag by approximately one inverter delay. In this manner, the duty cycle of both outputs shown in FIG. 2 will be skewed so that within a cycle, the high state is slightly longer than the low state, relative to the ECL inputs.

FIG. 3 (PRIOR ART) shows a fully differential and complementary implementation 300 of circuit 100 in FIG. 1. A complementary circuit is well known to those skilled in the art, and is one in which a second circuit is overlaid in a "mirror-image" fashion. The polarity of all the BJTs are flipped from NPN to PNP or vice versa, while the polarity of all MOSFETs are flipped from PMOS to NMOS or vice versa. In general, the signals and bias voltages will be of similar magnitude and opposite polarity mirrored about the half-way point between the two supply rails. Circuit 300 can only be implemented in a process that includes NPN and PNP BJTs, as well as CMOS devices. Such processes are needed for complementary circuits, and are often used in high speed, low-noise circuits. In FIG. 3, input transistors 310 and 315 are connected to two PNP voltage followers 360 and 375, which further drive the gate terminals of two N-MOSFET transistors 385 and 390. In addition, the complementary side includes two input transistors 320 and 325 that are connected to two NPN voltage followers 345 and 365, that drive the gate terminals of two P-MOSFET transistors 377 and 380.

The four voltage followers (345, 365, 360, and 375) drive four MOSFETs (377, 380, 385, and 390) that create the first CMOS rail-to-rail logic signals at the output. There is no need for a latch circuit similar to circuit 200 shown in FIG. 2. As circuit 300 is merely a complementary version of FIG. 1, it has the same properties and shortcomings with respect to how the MOSFET gates are driven. That is, the gate drive to the off state is quick, with the emitter followers acting as voltage sources. The gate drive to the on state will be current limited and therefore slower and noisier, unless the quiescent current sources are increased substantially. In that case, the noise level rises anyway due to base current noise flowing through the resistors which creates noise on the base nodes.

Although an alternative to FIG. 3 may be to change the four BJT voltage follower devices (345, 365, 360, and 375) to their respective polarity MOSFETs, it may introduce considerable variability to the DC levels. This is because the $Vgs_{(ON)}$ changes with bulk voltage and additional noise such as of the 1/f variety.

Therefore, an improve solution is needed to the circuit shown in FIG. 3 without an increase in the bias current levels of the voltage followers, irrespective of the particular class of transistors used to implement the voltage followers.

BRIEF DESCRIPTION OF THE DRAWINGS

The inventions claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

DETAILED DESCRIPTION

The present teaching relates to clock driver circuitry in general. More specifically, the present teaching relates to a BiCMOS clock driver circuitry to improve the phase noise performance of the clock driver.

The present teaching discloses a circuit suitable for use as a clock driver with reduced phase noise compared with each of the above prior art circuits. The improvement is achieved at the interface between the Bipolar (ECL) section and the CMOS section by actively driving the first MOSFET gates both up and down. In some embodiments, one direction is driven by a BJT emitter follower, while the other direction is driven by using a MOSFET switch to shuffle charge stored on a dummy MOSFET gate. It is understood that other embodiments are also possible in accordance with the scope as recited in the claims.

Figure 3:
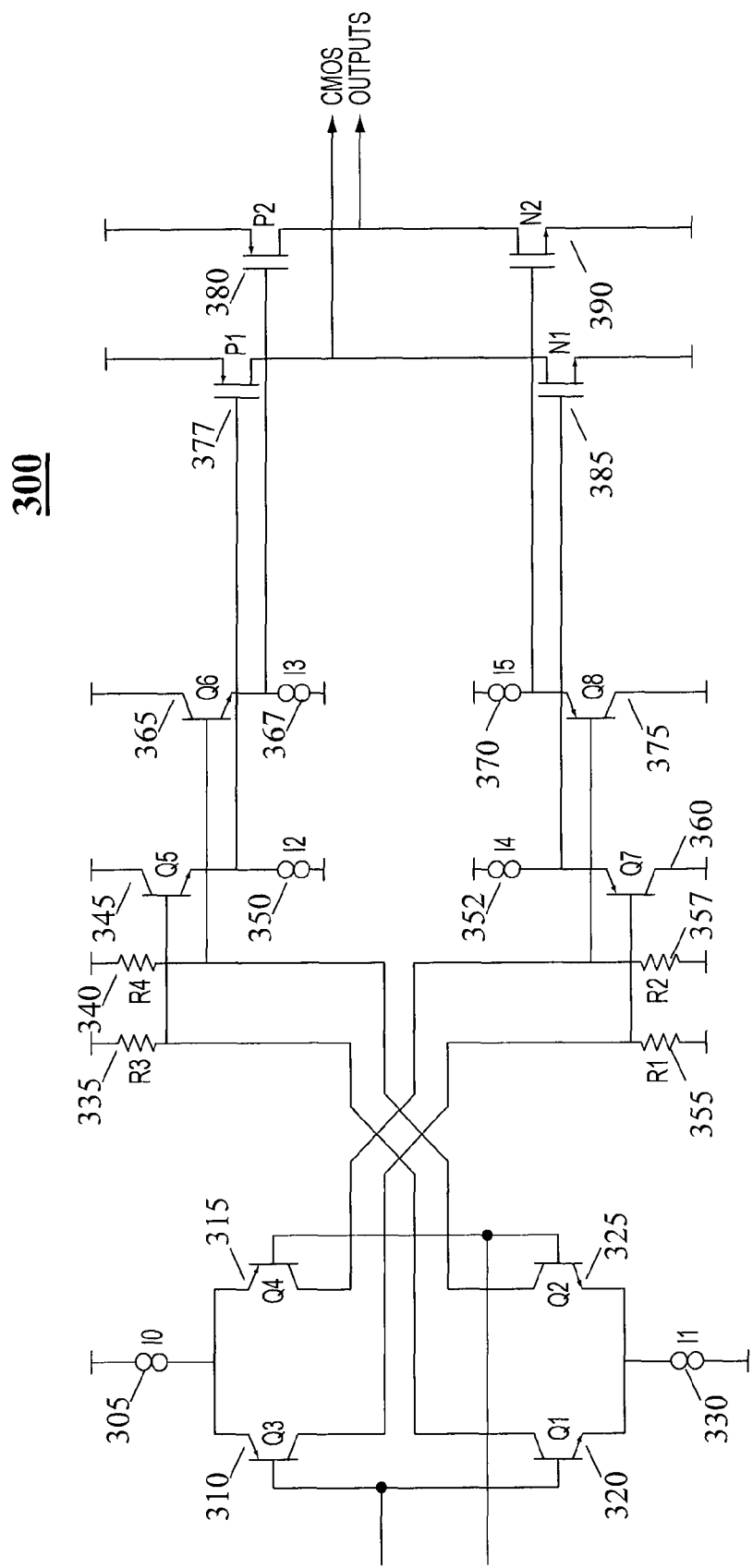
FIG. 3 (PRIOR ART) shows a fully differential and complementary implementation of a circuit for driving a set of MOSFET gate terminals from conventional ECL logic to create conventional CMOS logic signals.
Figure 4:
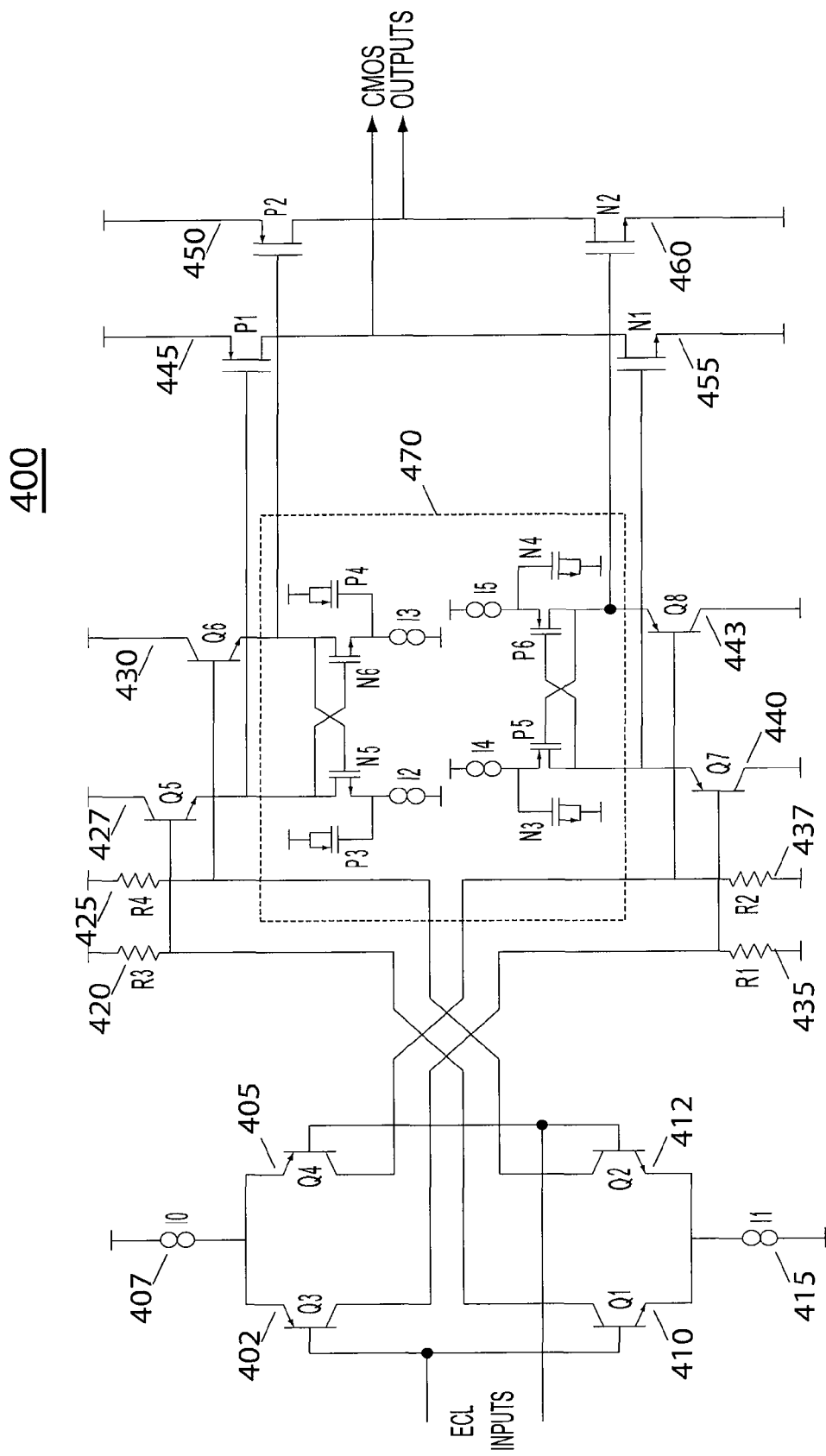
FIG. 4 shows an exemplary embodiment of a fully differential and complementary circuit for driving a set of MOSFET gate terminals from conventional ECL logic to create conventional CMOS logic signals, according to an embodiment of the present teaching.

FIG. 4 shows an exemplary embodiment of a fully differential and complementary circuit 400 for driving a set of MOSFET gate terminals from conventional ECL logic, according to an embodiment of the present teaching. Compared with circuit 300 shown in FIG. 3, circuit 400 includes additional MOSFETs at the output of each of the four emitter followers 427, 430, 440, and 443. The added MOSFETs are enclosed in 470 and they are transistors N5, N6, P3, P4 (as one group connected to emitter followers 427 and 430) and P5, P6, N3 and N4 (connected to emitter followers 440 and 443).

The added transistors are structured as follows. Transistor N5 is an NMOS device with its source connected to a current source I2 and its drain connected to the emitter of transistor 427 (Q5). Transistor N6 is an NMOS device with its source connected to a current source I3 and its drain connected to the emitter of transistor 430 (Q6). The gate of N5 is connected to the drain of transistor N6 and the gate of transistor N6 is connected to the drain of transistor N5. This is an important feature of the present teaching. As disclosed herein, with this arrangement, transistors N5 and N6 are constructed to serve as switches or so called switch MOSFETs.

Another important feature of the present teaching relates to a capacitor placed at the source of each of transistors N5 and N6. As shown in FIG. 4, a device labeled as P3 is a PMOS transistor with its drain and source connected to the positive rail and its gate connected to the source of transistor N5. Similarly, with respect to transistor N6, a device labeled as P4 is a PMOS transistor with its drain and source connected to the positive rail and its gate connected to the source of transistor N6. The intended function of devices P3 and P4 is that each acts as a capacitor, i.e., a charge reservoir. The connections as shown in FIG. 4 enable dummy devices P3 and P4 to act as such.

Regarding the complementary portion of the circuit shown in FIG. 4, transistor P5 is a PMOS device with its source connected to a current source I4 and its drain connected to the emitter of transistor 440 (Q7). Transistor P6 is a PMOS device with its source connected to a current source I5 and its drain connected to the emitter of transistor 443 (Q8). Similarly, the gate of transistor P5 is connected to the drain of transistor P6 and the gate of transistor P6 is connected to the drain of transistor P5. In this exemplary embodiment, there are four switch MOSFETS, illustrated as N5, N6, P5, and P6. Transistors P5 and P6 together serve as switch MOSFETSs, as will be explained below. Same as for the complementary part of circuit 400, with respect to each of transistors P5 and P6 in the switching circuit 470, there is a capacitor placed at the source of each of the switch MOSFETs. As shown on FIG. 4, a device N3 is an NMOS transistor with its drain and source connected to the negative rail and its gate connected to the source of transistor P5. A device N4 is an NMOS transistor with its drain and source connected to the negative rail and its gate connected to the source of transistor P6. The role of each of transistors N3 and N4 is to serve as a capacitor, i.e., a charge reservoir. With the circuit arrangement shown in FIG. 4, N3 and N4 can achieve such intended functionality.

Circuit 400, as shown in FIG. 4, may be appropriate to operate as a logic translator; however, because static and equal voltages at the input generates a shoot-through in the output transistor pairs, pair 445/455 (N1/P1) and pair 450/460 (N2/P2), in some embodiments, a latch or a hysteretic stage (not shown) may be deployed prior to the inputs shown in FIG. 4, to assure that such inputs are either at ECL logic levels or transitioning between the logic levels.

In the static state having the input to the bases of transistors 402 and 410 (Q1 and Q3) at a voltage higher than that to the bases of transistors 405 and 412 (Q2 and Q4), the current from current source 415 (I1) is steered through transistor 410 (Q1) to resistor 420 (R3). The current from current source 407 (I0) is steered through transistor 405 (Q4) to resistor 437 (R2). With no current flowing through resistor 425 (R4), the gate voltage of PMOS P2 is pulled up towards the positive rail by NPN emitter follower 430 (Q6) and so is the gate voltage of NMOS transistor N5. The current from current source I2 is therefore flowing through transistor N5, pulling down the gate voltage of PMOS transistor 445 (P1) until NPN emitter follower 427 (Q5) conducts. Because of the current flowing through resistor 420 (R3), Q5 will not conduct until the gate to source voltage of transistor 445 (P1) is substantially larger than a Vgs threshold, and therefore device P1 is fully enhanced.

When the circuit remains in this static state, the gate voltage of transistor N6 is below the positive rail by a voltage in the amount of I*R on resistor 420 (R3) plus the Vbe of transistor 427 (Q5). Maintaining such a state for an adequate amount of time, current source I3 pulls the gate voltage of P4 (a capacitor connected device) low enough so that transistor N6 will then resume carrying the current from current source I3. However, this is not a requirement for the circuit to operate, as will be discussed below.

In the counterpart circuit at lower half of circuit 400, when no current is flowing through resistor 435 (R1), the gate voltage of NMOS transistor 455 (N1) is pulled down towards the negative rail by PNP emitter follower transistor 440 (Q7) and so is the gate voltage of PMOS transistor P6. The current from current source I5 is therefore pushed through transistor P6, pulling up the gate voltage of NMOS transistor 460 (N2) until PNP emitter follower transistor 443 (Q8) conducts. Because of the current flowing through resistor 437 (R2), Q8 will not conduct until the gate to source voltage of transistor 460 (N2) is substantially larger than a Vgs threshold, and therefore device N2 is fully enhanced.

When the circuit remains in this static state, the gate voltage of transistor P5 is higher than the negative rail set by a voltage drop measured in the amount of I*R on resistor 437 (R2) and the Vbe of transistor 443 (Q8). Maintaining this state for an adequate amount of time, current source I4 pulls the gate voltage of transistor N3 (a capacitor connected device) high enough so that transistor P5 will resume to carry the current from current source I4. Similarly, this is not a requirement for the circuit to operate, as will be seen below.

The improvement achieved by circuit 400 may be best illustrated at the transitions between logic states. Because circuit 400 is fully differential, the above description of what happens at a static logic state is simply reversed in case of an opposite static logic state. Similarly, the functionality described below is for the case of transitioning from the state described above to an opposite state. A description discussing an opposite case reflects the situation related to transitioning to the static logic state described above.

At a transition, when the input connected to the bases of transistors 410 (Q1) and 402 (Q3) falls to a lower voltage than the input to the bases of transistors 412 (Q2) and 405 (Q4), the currents of current sources 407 (I0) and 415 (I1) are steered to the opposite resistors on the collectors of the respective differential pairs. The functionalities as a reaction to the input to the bases of the four BJT emitter followers (transistors 427, 430, 440, and 443) are the same as that described with reference to circuit 300 shown in FIG. 3.

Due to the collapse of the current at the collector of transistor 410 (Q1), resistor 420 (R3) pulls the voltage on the base of transistor 427 (Q5) up to the positive supply rail. Since transistor 427 (Q5) is an emitter follower transistor, it directly pulls up the gate terminal of transistor 445 (P1), quickly turning it off, as was the case described with respect to FIG. 3. However, transistor 427 (Q5) also pulls up the gate voltage of transistor N6 in circuit 400. Because transistor P4 (capacitor connected device) was charged to a voltage much larger than a Vgs threshold lower than this, transistor N6 is turned on, acting as a switch connecting together the gate terminals of PMOS devices P4 and P2. This provides an active pull-down of the gate voltage of output device 450 (P2). Because it is actively driven from the input signal (through transistors Q1-R3-Q5-N6), the time base noise does not depend on the noise of current source I3.

In the counterpart circuit of the differential circuit 400, current from current source 415 (I1) is pulled by transistor 412 (Q2) and flows through resistor 425 (R4), thus pulling down the base voltage of the emitter follower transistor 430 (Q6). As noted in the discussion above with reference to FIG. 3, this cannot ensure that the gate voltage of transistor 450 (P2) is actively pulled low. However, in circuit 400, because of the N6 switch action as disclosed herein, the gate voltage of transistor 450 (P2) is pulled low quickly. With the gate of transistor 450 to be at a lower voltage, transistor N5 is turned off because the capacitor connected P3 device keeps the source terminal of transistor N5 from immediately getting pulled down by current source I2. When the gate of transistor P3 is pulled low enough, transistor N5 then starts conducting current. The exact time at which this occurs may fluctuate (timing related noise) due to the noise from current source I2. However, such noise from current source I2 has no impact on the output so the phase noise performance of the signal path does not degrade with respect to the noise of the current source.

In addition, with regard to the lower half of circuit 400, due to the collapse of the current from the collector of transistor 405 (Q4), it causes resistor 437 (R2) to pull down the voltage of the base of transistor 443 (Q8) to the negative supply rail. Transistor 443 (Q8) is also an emitter follower and it then directly pulls down the gate voltage of transistor 460 (N2). This quickly turns off transistor 460, as was the situation discussed herein with reference to FIG. 3. However, in circuit 400, transistor 443 (Q8) also pulls down the gate voltage of P5. Because the capacitor connected N3 device was charged to a voltage much higher than a Vgs threshold compared with the gate voltage of P5, transistor P5 is turned on, acting as a switch connecting together the gate terminals of NMOS devices N3 and N1. In this manner, circuit 400 provides an active pull-up of the gate voltage of output device N1. In addition, because the gate of N1 is actively driven from the input signal (through Q4-R2-Q8-P5), the time base noise does not depend on the noise of current source I4.

Regarding the operation on the remaining side of the lower half of circuit 400, the current of current source 407 (I0) is re-directed by transistor 402 (Q3) and flows through resistor 435 (R1), thus pulling up the base voltage of emitter follower transistor 440 (Q7). As discussed with respect to circuit 300 shown in FIG. 3, this does not ensure that the gate voltage of transistor 455 (N1) is actively pulled high. However, in circuit 400, with the switch action associated with transistor P5 as described herein, the gate voltage of transistor 455 (N1) is pulled high quickly. With the gate voltage of transistor 455 at a higher voltage, transistor P6 is turned off because the capacitor connected device N4 keeps the source terminal of transistor P6 from being immediately pulled up by current source I5. In this manner, only when the gate voltage of transistor N4 is pulled high enough, will transistor P6 resume conducting current. The exact time at which this happens may fluctuate because of the noise from current source I5. However, such a noise has no impact on the output so the phase performance of the signal path does not degrade as a function of such noise.

With the operation of circuit 400, as disclosed herein, the transition, as described, has the gate voltages of both output devices 455 (N1) and 445 (P1) actively pulled high, and the common-connected drains of N1 and P1 actively pulled low, all with a minimum of added phase noise. In addition, both gate voltages of output devices 460 (N2) and 450 (P2) are actively pulled low and their common-connected drains are actively pulled high with a minimum of added phase noise.

In some embodiments of the invention, the capacitors used are implemented as capacitor connected MOSFETs, as shown in FIG. 4. The polarity type of the MOSFET may be chosen to match the type of the device to which the capacitor is actively connected. For example, device P3 is a PMOS device and it may be chosen to match PMOS device P1. Similarly, device P4 is a PMOS type matching the PMOS device P2. This may make it easier to control the ratio of capacitances between the two with a geometric design. Variations due to temperature and wafer processing may track better as well. However, other arrangements are also possible. For instance, capacitors used may also be made using a different construction such as a parallel plate capacitor or a diode connected MOSFET of the opposite polarity.

In some embodiments of the present teaching, the capacitance of the capacitor connected MOSFETs may be chosen to be larger than that of the output devices for a number of reasons. For example, the gate to drain capacitance of an output device is multiplied by the Miller effect, whereas the capacitor connected device does not experience such an effect. As another example, the gates of both the output MOSFET and the capacitor connected MOSFETs may each swing about the same change in voltage throughout a full signal cycle. Thus, when the capacitances of the two are made equal, the change in voltage experienced by the two capacitances as the charge is redistributed when the MOSFET switch between the two capacitances closes, will be one half of that swing. Since the Vgs threshold of the output devices is generally similar but not exactly at a half-way point, it is desirable to drive the output device gate terminal more than half way through the range with the charge redistribution. Having a large capacitor connected device may enable that.

There may be some issues associated with having a larger capacitor connected device. For example, the re-charging occurring after an inactive transition usually takes longer. There may be an increase in the quiescent current level needed for the same charging time. The quiescent current level can be chosen based on an expected maximum operating frequency. For example, if a capacitor connected device is no more than 50 or 100% larger than that of the output device, the additional current drawn is minimal compared to what would be needed by the circuit shown in FIG. 3 in order to get the same transition speed with still an improvement in phase noise.

Another feature associated with circuit 400 is the following. The voltage swing on the resistors, plus the Vbe of the emitter follower, plus the Vgs of the switch MOSFETs may approach a voltage that equals or exceeds the total supply voltage. For instance, while circuit 400 can operate on a 5V voltage supply, it may also be appropriate to operate with a 3.3V supply as well. With the industry standard 10% tolerance, the voltage supplied can be as low as 3.0V. With an 800 mVp-p swing at the resistors and 800 mV Vbe in the emitter followers, over one half of the supply voltage may be consumed.

The switch MOSFETs may operate in a manner to have sources away from the rail to which their bulk is most commonly tied. This increases the Vgs threshold voltage unless the bulk can be floated and tied to the source terminal. In some cases, this is not always possible. In some scenarios, it may not be desirable. With a worst case over temperature of 900 mV for the BJT Vbe and perhaps 1.2V for the MOSFET Vgs, a total span from the rail is 2.9V, leaving just 100 mV of headroom for the I2-I5 current sources. With ground bounce or other dynamic swings, the headroom may vanish entirely.

Such issues, if present, are not fatal to circuit 400 for the following reasons. A current source that collapses in a benign way when the compliance headroom is insufficient (e.g., a current source implemented with a MOSFET output device) is generally acceptable in circuit 400. Although the capacitor connected MOSFET may stop charging, at the time the charging stops, such a capacitor connected MOSFET may already have most of the voltage change needed and, hence, most of the desired charge stored. In this case, there is no need to get the switch MOSFET to conduct current. This may de-bias the emitter follower on its drain, but due to the fact that, at the transition, the emitter follower discharges the Cgs of the output MOSFET and may have adequate amount of bias current pulling that charge out.

After the transition is complete, the emitters of Q5-Q8 can just remain idle without negative side effects. If there are leakage currents at a node, the voltage may drift, leading to either anomalous behavior or a limit on the lowest frequency of operation. If this is not acceptable in a particular application, a small current source may be added to address the issue. Such an added current source may be set to be one tenth or less the value of current sources I2-I5, in order to independently provide a minimum bias level to each of the emitter followers. Because emitters of Q5-Q8 are on the other side of switch MOSFETs compared to the connections of I2-I5, there is usually plenty of headroom for such small additional current sources.

In the illustrated embodiment as shown in FIG. 4, the capacitor connected MOSFETs are connected to the supply voltage that is used in their respective half circuit. It is understood that this arrangement is not a necessity and the present teaching can be implemented by having such capacitors connected to any static or quasi-static node. As is well known in the art, CMOS circuitry draws significant current spikes from voltage supply rails during transitions and can therefore create sizable voltage "bounce" on the power supplies. The illustrated arrangement of circuitry 400 provides certain immunity to this phenomenon.

The inclusion of switch MOSFETs N5, N6, P5, & P6 improves the performance of circuit 400 over that of circuit 300 by hastening the speed at which MOSFETs N1, N2, P1, & P2 are turned on to full enhancement. In general, they play no role in turning off MOSFETs N1, N2, P1, & P2, which occurs quickly because of the emitter followers Q5, Q6, Q7, & Q8 in circuit 400. The switch MOSFETs provide a large surge of current from their respective capacitor connected MOSFETs at the right time in the critical transition, i.e., the one in which a particular switch MOSFET is turning on its associated MOSFET N1, N2, P1, or P2. The switch MOSFETs are not critical during the other transition. Switch MOS- FETs N5 and P6 are critical during the transition which turns on devices P1 and N2. Switch MOSFETs N6 and P5 are critical during the transition which turns on devices P2 and N1.

It is noted that that the design criteria for the switch MOSFET transistors N5, N6, P5, and P6 may differ substantially from that for other MOSFETs shown in circuit 400. Each of the switch MOSFETs is driven as a switch at a critical transition and are turned off at the other transition, with an active linear operation only during the idle times in between. In none of these situations is the noise of such a switch MOSFET anywhere nearly as important as it is for the output MOSFETs or the BJT transistors. Therefore, while the output devices (e.g., P1, P2, N1 and N2) need to be designed for the minimum noise possible, the switch MOSFETs can be optimized in terms of other criteria such as switching speed or channel resistance.

To fully exploit the advantage of the present teaching, the circuit 400 as shown in FIG. 4 can be driven with inputs that can transition as quickly as possible. As mentioned earlier, while this may be suitable for other reasons, a preceding stage with a latch or hysteresis may be sufficient to ensure that the transition can occur at a fast speed.

Circuit 400 as shown in FIG. 4 is also beneficial in terms of physical implementation, as compared with prior art circuit 300 shown in FIG. 3. The output impedances of current sources I2-I5 (350, 367, 352, and 370) in FIG. 3, typically dominated by output capacitances for high-speed circuit design, directly impact the phase noise performance of circuit 300. This is because such current sources in FIG. 3 reduce the slew rate of the output gate drive nodes. However, in accordance with the present teaching, the four current sources I2-I5, as shown in FIG. 4, have a capacitor connected thereto and that capacitor is a part of the improvement disclosed herein. With such a circuitry arrangement, the output capacitance of the current sources is not as critical and in fact, the output capacitance of the current sources I2-I5 in FIG. 4 helps to improve the phase noise performance.

In the illustrated implementation shown in FIG. 4, the values of like circuit elements may generally be made same or similar. For instance, R3=R4=R1=R2, I0=I1, and I2=I3=I4=I5. In addition, for differential symmetry, I2=I3, I4=I5, R3=R4, and R1=R2. However, it is understood that there is no additional required identities or similarity in the illustrated embodiment. For instance, in a process having NPNs significantly faster than PNPs, it may be helpful to skew the relationship between current sources I2-I5 and resistors for the upper half circuit (420 and 425) versus the lower half circuit (435 and 437). Another reason to create such a skew may be that if there is a significant imbalance in the NMOS vs PMOS Vgs thresholds, in which case the I1*R3 product desired could be skewed relative to the I0*R1 product. Such design variations are all within the scope of the invention. One preferred skew to the output MOSFET devices channel lengths and widths may be generated based on differences in NMOS and PMOS noise performances. That is, different geometries (length, width) desired for the NMOS and PMOS devices N1, N2, and P1, P2 such that the noise levels of the two pairs are comparable.

Figure 5:
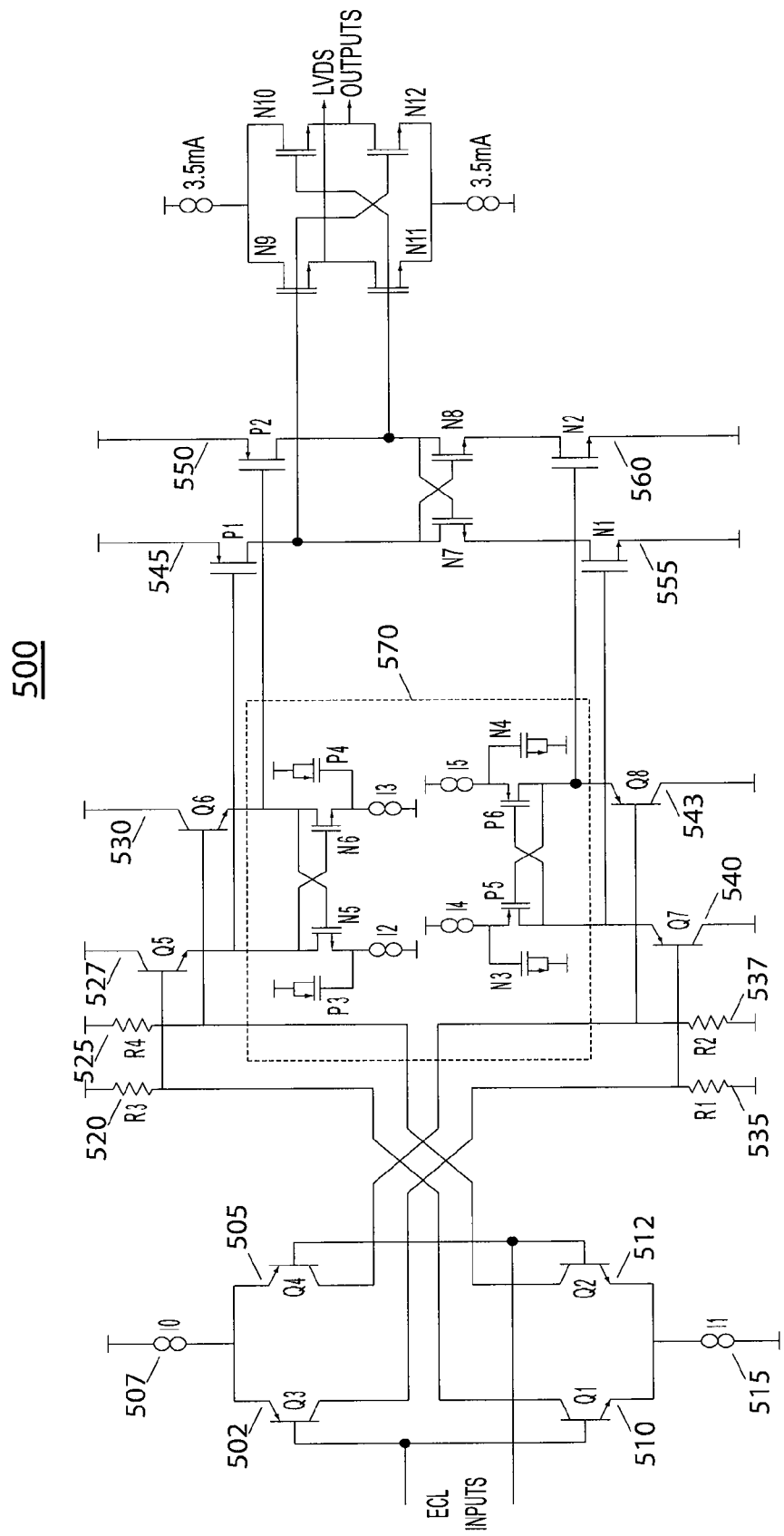
FIG. 5 shows an exemplary embodiment of a fully differential and complementary circuit for driving a set of MOSFET gate terminals from conventional ECL logic to create standard LVDS logic signals, according to an embodiment of the present teaching.

FIG. 5 shows an exemplary embodiment of a fully differential and complementary circuit for driving a set of MOSFET gate terminals from conventional ECL logic to create standard LVDS logic signals, according to an embodiment of the present teaching. This circuit creates Low Voltage Differential Signaling (LVDS) outputs with the phase noise improvement of FIG. 4.

LVDS is defined by the TIA/EIA-644-A standard and will generally require more circuitry than shown in FIG. 5, such as active control of at least one of the 3.5 mA current sources to ensure that the output Offset Voltage (as defined in the standard) complies with specification 4.1.2. Circuitry for doing these and other things necessary for compliance can be completely of conventional structure and still realize the phase noise improvement of FIG. 5.

The LVDS signals are created by steering the 3.5 mA current sources through either the N9 & N12 steering N-channel MOSFETs, or through the N10 & N11 steering N-channel MOSFETs. When combined with the 100 Ohms differential termination at the LVDS receiver, a differential voltage of approximately 350 mV can be created in this way. To turn on NMOS devices N9 & N12, their gate node, which is tied to the drain of P1 and N7, must be pulled high. To turn on NMOS devices N10 & N11, their gate node, which is tied to the drain of P2 and N8, needs to be pulled high.

The operation of FIG. 5 is the same as for that of FIG. 4 up the four MOSFETs labeled N1, N2, P1, & P2. The circuit in FIG. 4 may be used to drive the steering MOSFETs N5-N8 to create LVDS signals. However, during the transitions there can be a brief instant when only devices N11 and N12 are on, but not N9 & N10. When only N11 or N12 are on, the lower 3.5 mA current sink can pull the output lines down in a dynamic fashion that may lead to difficulties complying with specification 4.1.5, Dynamic output signal balance, of the LVDS standard.

The addition of the N7 & N8 NMOS devices in the drains of N1 & N2 respectively, changes the dynamic behavior while creating the LVDS signals. Specifically, the transition in which the drain of P1 goes from low to high, and therefore the drain of P2 goes from high to low, the drain of P1 will rise as soon as voltage follower Q5 and switching MOSFET N5 pull the gate of P1 low. However, unlike in FIG. 4, the drain of P2 will not be pulled low as soon as voltage follower Q8 and switch MOSFET P6 pull the gate of N2 high. Rather, the drain of P1 must rise in voltage sufficiently to turn on cross-coupled device N8. At that time, the drain of N2 will be able to pull the drain of P2 low.

By providing steering NMOS devices N9-N12 with gate drive signals that are delayed on the falling edge, but not on the rising edge, the Dynamic output signal balance is improved. When the drain of P1 rises sooner relative to the fall of the drain of P2, the length of time during which both N9 and N10 are off is either greatly reduced or substantially eliminated.

Figure 6:
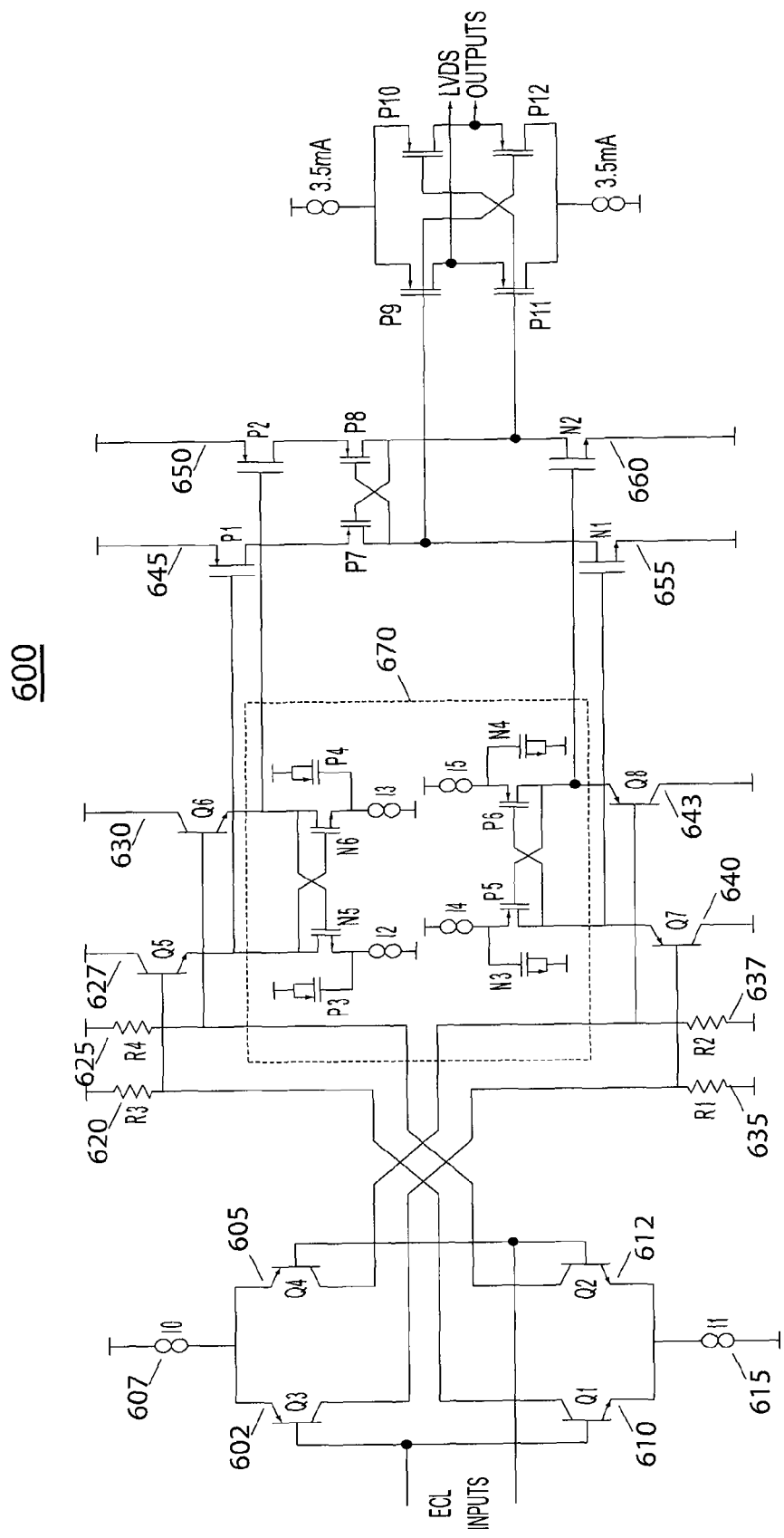
FIG. 6 shows an alternative embodiment of a fully differential and complementary circuit for driving a set of MOSFET gate terminals from conventional ECL logic to create standard LVDS logic signals, according to an embodiment of the present teaching.

FIG. 6 shows a different embodiment of a fully differential and complementary circuit for driving a set of MOSFET gate terminals from conventional ECL logic to create standard LVDS logic signals, according to an embodiment of the present teaching. In circuit 600, the output section for converting from the CMOS drive provided by N1, N2, P1, & P2 to an LVDS output is replaced by the mirror image of that shown in FIG. 5.

The steering MOSFETs in FIG. 6 are now PMOS devices P9 through P12, and the dynamic output signal balance can be corrupted to the extent that devices P11 & P12 are off while device P9 or P10 are on. FIG. 6 reduces this in the same functional manner as what is achieved by circuit 500 in FIG. 5, by changing the timing of the edges of the gate drive signals. In this case, the cross-coupled devices P7 & P8 delay the rising edge but not the falling edge of the signals as the drains of N1 & N2.

In some situations, circuit 600 as shown in FIG. 6 may encounter some issues. For example, the low-level output under TIA/EIA-644-A may be less than 1V relative to ground, which may not be enough to fully enhance steering devices P11 & P12. Generally, floating the well is likely needed to avoid the bulk effect. However, for a device powered from a 1.8V supply, this may be easier to deal with than driving steering devices N9 & N10 in FIG. 5.

Figure 1:
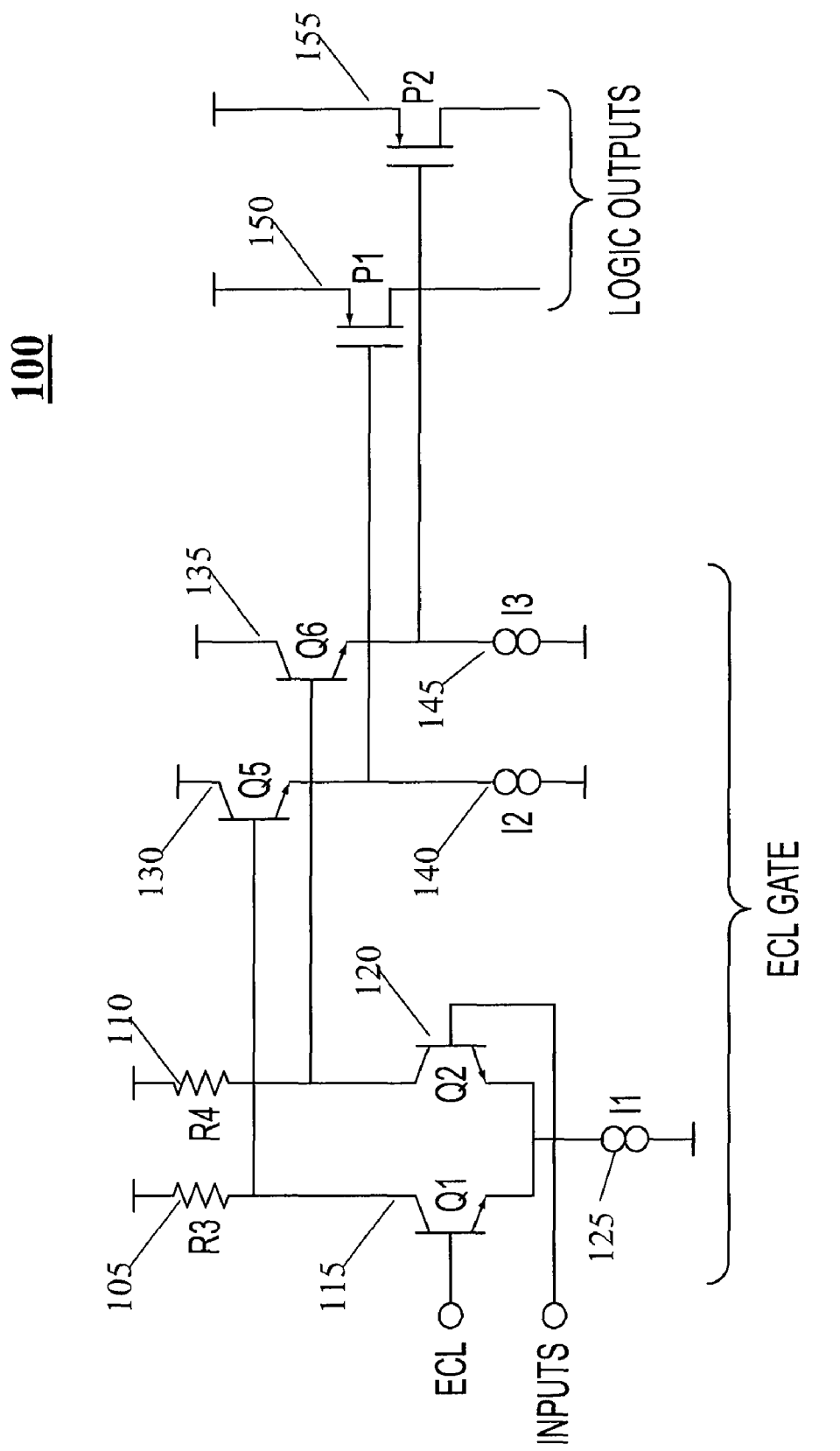
FIG. 1 (PRIOR ART) illustrates a circuit for driving a pair of PMOS gate terminals from conventional ECL logic.
Figure 2:
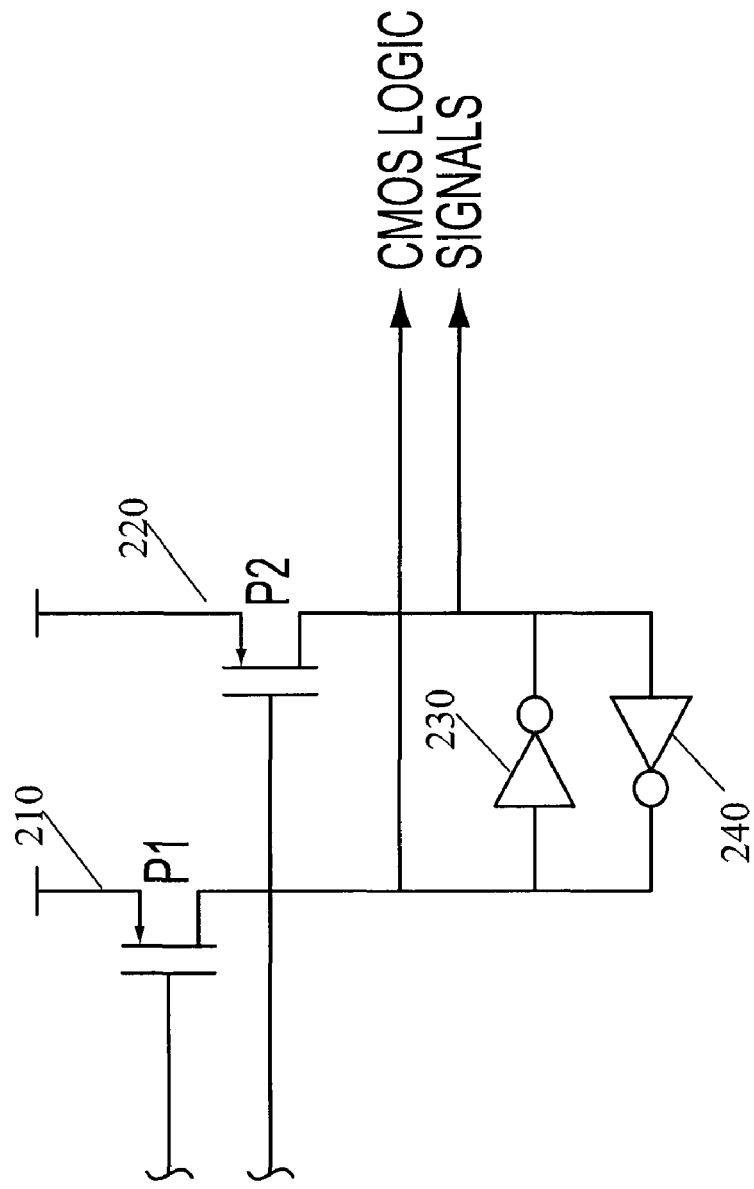
FIG. 2 (PRIOR ART) shows a prior art solution to create conventional CMOS logic signals.

There can be various implementations to practice the present teaching. For instance, the upper half circuit of FIGS. 4-6, comprising P1 and P2 drive circuitry, can be used with the output connection of FIG. 2, which yields a circuitry that can provide an improved phase noise level over the circuitry of FIG. 1. Although the input differential transistor pairs 402, 410, 405, and 412 (Q1-Q4) are shown as BJTs, they may be implemented based on MOSFETs. To save power, the I2-I5 current sources as shown in FIGS. 4-6 may be dynamically varied with respect to the operating frequency of the circuit. Alternatively, a non-linear current source may be used which may fall to a lower idle value once the capacitor connected MOSFETs are sufficiently charged.

It may also be possible to change the voltage followers from BJT emitter followers to MOSFET or even JFET source followers. The polarity, PNP/P-FET vs. NPN/N-FET would stay the same, and the voltage follower connections to the circuit are the same. Some minor changes to the biasing levels would be needed due to the differences in Vbe and Vgs(ON) levels, as is well known in the art. To make such a substitution, the voltage follower input terminal changes from a BJT base to a FET gate, the output terminal changes from a BJT emitter to a FET source, while the supply terminal changes from a BJT collector to a FET drain.

The implementations as illustrated have inputs compatible with ECL, emitter-coupled logic. There has been a proliferation of CML, current-mode logic, in recent years. A skilled person in the art would agree that they could easily be substituted by omitting the differential pairs on the inputs and feeding the differential currents to the resistors R1 to R4. Indeed, it should be possible to adapt the input taking circuit to accept any small-signal logic input signals, including LVDS, by using the appropriate level translations and impedance changes as necessary.

FIGS. 4-6 include current sources which are well known to those skilled in the art, and can be implemented using BJTs or MOSFETs, and in some cases even just resistors.

While the inventions have been described with reference to the certain illustrated embodiments, the words that have been used herein are words of description, rather than words of limitation. Changes may be made, within the purview of the appended claims, without departing from the scope and spirit of the invention in its aspects. Although the inventions have been described herein with reference to particular structures, acts, and materials, the invention is not to be limited to the particulars disclosed, but rather can be embodied in a wide variety of forms, some of which may be quite different from those of the disclosed embodiments, and extends to all equivalent structures, acts, and, materials, such as are within the scope of the appended claims.

I claim:

1. An apparatus for a CMOS clock driver, comprising:
   a first input taking circuit for receiving small-signal logic inputs;
   a first voltage follower circuit coupled to the first input taking circuit for generating a first set of voltage follower outputs;
   a first output circuit coupled to the first voltage follower circuit for receiving the first set of voltage follower outputs as inputs and generating output signals;
   a first switching circuit to which the first voltage follower circuit is coupled; and
   first and second capacitors comprising charge reservoirs; wherein
   the first switching circuit is coupled to the first set of voltage follower outputs and to the first and second capacitors and is deployed for reducing the phase noise level of the output signals.

2. The apparatus according to claim 1, wherein the output signals correspond to complementary metal-oxide (CMOS) output signals.

3. The apparatus according to claim 1, wherein the first switching circuit comprises:
   a first sub-circuit coupled to a first output of the first set of voltage follower outputs and to a first current source; and
   a second sub-circuit coupled to a second output of the first set of voltage follower outputs and to a second current source, wherein
   the first and second sub-circuits are coupled to each other.

4. The apparatus according to claim 3, wherein the first sub-circuit comprises:
   a first p-channel metal oxide semiconductor (PMOS) transistor having its drain coupled to the first output of the first voltage follower outputs and its source coupled to the first current source and the first capacitor.

5. The apparatus according to claim, wherein the second sub-circuit comprises:
   a second PMOS transistor having its drain coupled to the second output of the first voltage follower outputs and its source coupled to a second current source and the second capacitor, wherein
   the first PMOS transistor has its gate connected to the drain of the second PMOS transistor and the second PMOS transistor has its gate connected to the drain of the first PMOS transistor.

6. The apparatus of claim 5, wherein:
   the first capacitor corresponds to a first n-channel metal oxide semiconductor (NMOS) transistor having its gate connected to the source of the first PMOS transistor and its source and drain terminals connected to each other; and
   the second capacitor corresponds to a second NMOS transistor having its gate connected to the source of the second PMOS transistor and its source and drain terminals connected to each other.

7. The apparatus of claim 5 wherein the second terminals of the first and second capacitor are tied to a negative rail.

8. The apparatus of claim 5, wherein the second voltage follower circuit comprises:
   a second voltage follower sub-circuit having its input connected to the collector of the second PNP transistor and a second resistor, its output connected to the drain of the second PMOS transistor in the first switching circuit, and its supply connected to a negative rail, wherein
   the first and second resistors are connected to a negative rail.

9. The apparatus according to claim 4,
   wherein the first input taking circuit comprises:
   a first PNP transistor having its base connected to a first of the small-signal logic inputs and its emitter connected to a third current source; and
   a second PNP transistor having its base connected to a second of the small-signal logic inputs and its emitter connected to the third current source; and
   wherein the first voltage follower circuit comprises:
   a first voltage follower sub-circuit having its input connected to the collector of the first PNP transistor and a first resistor, its output connected to the drain of the first PMOS transistor in the first switching circuit, and its supply connected to a negative rail.

10. The apparatus according to claim 9, wherein the first output circuit comprises:
a third NMOS transistor having its gate connected to the output of the first voltage follower sub-circuit, its source to a negative rail, and its drain to receive a first of the output signals; and
a fourth NMOS transistor having its gate connected to the output of the second voltage follower sub-circuit, its source to a negative rail, and its drain to receive a second of the output signals.

11. The apparatus of claim 1, wherein the small logic inputs are emitter coupled logic (ECL) inputs.

12. The apparatus of claim 1, wherein the first input taking circuit comprises:
a first PNP transistor having its base connected to a first of the small-signal logic inputs and its emitter connected to a third current source; and
a second PNP transistor having its base connected to a second of the small-signal logic inputs and its emitter connected to the third current source.

13. The apparatus of claim 12, wherein an implementation of the third current source includes at least one of:
a bipolar junction transistor (BJT);
a metal-oxide-semiconductor field-effect transistor (MOSFET);
a resistor; and
any combination thereof.

14. The apparatus according to claim 1, further comprising a complimentary circuit, comprising:
a second input taking circuit for receiving the small-signal logic inputs;
a second voltage follower circuit coupled to the second input taking circuit for generating a second set of voltage follower outputs;
a second output circuit coupled to the second voltage follower circuit for receiving the second set of voltage follower outputs as inputs and generating the output signals; and
a second switching circuit connected to the second set of voltage follower outputs and being deployed for reducing the phase noise level of the output signals.

15. The apparatus according to claim 14, wherein the second switching circuit comprises:
a third sub-circuit connected to a first output of the second set of voltage follower outputs and coupled to a fourth current source; and
a fourth sub-circuit connected to a second output of the second set of voltage follower outputs and coupled to a fifth current source, wherein
the third and fourth sub-circuits are coupled to each other.

16. The apparatus according to claim 15, wherein the third sub-circuit comprises:
a fifth NMOS transistor having its drain coupled to the first output of the second set of voltage follower outputs and its source coupled to the fourth current source and a third capacitor.

17. The apparatus according to claim 16, wherein the fourth sub-circuit comprises:
a sixth NMOS transistor having its drain coupled to the second output of the second set of voltage follower outputs and its source coupled to a fifth current source and a fourth capacitor, wherein the fifth NMOS transistor has its gate connected to the drain of the sixth NMOS transistor and the sixth NMOS transistor has its gate connected to the drain of the fifth NMOS transistor.

18. The apparatus according to claim 17, wherein:
the third capacitor corresponds to a third PMOS transistor having its gate connected to the source of the fifth NMOS transistor and its source and drain terminals connected to each other; and
the fourth capacitor corresponds to a fourth PMOS transistor having its gate connected to the source of the sixth NMOS transistor and its source and drain terminals connected to each other.

19. The apparatus according to claim 17, wherein the second terminals of the third and fourth capacitor are tied to a positive rail.

20. The apparatus according to claim 14, wherein the second input taking circuit comprises:
a first NPN transistor having its base connected to a first of the small-signal logic inputs and its emitter connected to a sixth current source; and
a second NPN transistor having its base connected to a second of the small-signal logic inputs and its emitter connected to the sixth current source.

21. The apparatus according to claim 20, wherein the second voltage follower circuit comprises:
a third voltage follower sub-circuit having its input connected to the collector of the first NPN transistor and a third resistor, its output connected to the drain of the fifth NMOS transistor in the third sub-circuit of the second switching circuit, and its supply connected to a positive rail;
a fourth voltage follower sub-circuit having its input connected to the collector of the second NPN transistor and a fourth resistor, its output connected to the drain of the sixth NMOS transistor in the fourth sub-circuit of the second switching circuit, and its supply connected to a positive rail, wherein
the third and fourth resistors are connected to a positive rail.

22. The apparatus according to claim 21, wherein the second output circuit comprises:
a fifth PMOS transistor having its gate connected to the output of the third voltage follower sub-circuit, its source to a positive rail, and its drain connected to a first of the output signals; and
a sixth PMOS transistor having its gate connected to the output of the fourth voltage follower sub-circuit, its source to a positive rail, and its drain connected to a second of the output signals.

23. The apparatus according to claim 14, further comprising a low voltage differential signaling (LVDS) output circuit coupled to the first and second output circuits to generate LVDS output signals.

24. The apparatus according to claim 23, wherein the LVDS output circuit comprises:
a fifth sub-circuit coupled to the output signals of the first and second output circuits; and
a sixth sub-circuit coupled to the output signals of the first output circuit and the fifth sub-circuit configured to generate LVDS output signals based on the output signals of the first output circuit.

25. The apparatus according to claim 24, wherein the fifth sub-circuit comprises:
a seventh PMOS transistor having its drain connected to a first of the output signals from the first output circuit and its source connected to a first of the output signals from the second output circuit; and an eighth PMOS transistor having its drain connected to a second of the output signals from the first output circuit and its source connected to a second of the output signals from the second output circuit, wherein a gate of the seventh PMOS transistor is connected to the drain of the eighth PMOS transistor, and a gate of the eighth PMOS transistor is connected to the drain of the seventh PMOS transistor.

26. The apparatus according to claim 25, wherein the sixth sub-circuit comprises:

a ninth PMOS transistor having its gate connected to a first of the output signals from the first output circuit, its source connected to a seventh current source, and its drain connected to a first of the LVDS output signals;

a tenth PMOS transistor having its gate connected to a second of the output signals from the first output circuit, its source connected to the seventh current source, and its drain connected to a second of the LVDS output signals;

an eleventh PMOS transistor having its gate connected to the second of the output signals from the first output circuit, its drain connected to an eighth current source, and its source connected to the first of the LVDS output signals; and a twelfth PMOS transistor having its gate connected to the first of the output signals from the first output circuit, its drain connected to the eighth current source, and its source connected to the second of the LVDS output signals.

27. The apparatus according to claim 23, wherein the LVDS output circuit comprises:

a fifth sub-circuit coupled to the output signals of the first and second output circuits; and a sixth sub-circuit coupled to the output signals of the second output circuit and the fifth sub-circuit configured to generate LVDS output signals based on the output signals of the second output circuit.

28. The apparatus according to claim 27, wherein the fifth sub-circuit comprises:

a seventh NMOS transistor having its drain connected to a first of the output signals from the second output circuit and its source connected to a first of the output signals from the first output circuit; and an eighth NMOS transistor having its drain connected to a second of the output signals from the second output circuit and its source connected to a second of the output signals from the first output circuit, wherein a gate of the seventh NMOS transistor is connected to the drain of the eighth PMOS transistor, and a gate of the eighth NMOS transistor is connected to the drain of the seventh NMOS transistor.

29. The apparatus according to claim 28, wherein the sixth sub-circuit comprises:

a ninth NMOS transistor having its gate connected to a first of the output signals from the second output circuit, its drain connected to a seventh current source, and its source connected to a first of the LVDS output signals;

a tenth NMOS transistor having its gate connected to a second of the output signals from the second output circuit, its drain connected to the seventh current source, and its source connected to a second of the LVDS output signals;

an eleventh NMOS transistor having its gate connected to the second of the output signals from the second output circuit, its source connected to an eighth current source, and its drain connected to the first of the LVDS output signals; and a twelfth NMOS transistor having its gate connected to the first of the output signals from the second output circuit, its source connected to the eighth current source, and its drain connected to the second of the LVDS output signals.

30. An apparatus for a clock driver, comprising:

an input taking circuit for receiving small signal logic inputs;

a voltage follower circuit coupled to the input taking circuit for generating a plurality of voltage follower outputs;

an output circuit coupled to the voltage follower circuit for receiving the plurality of voltage follower outputs as inputs and generating output signals;

a first switching circuit to which the voltage follower circuit is coupled; and first and second capacitors comprising charge reservoirs; wherein the switching circuit is connected to the plurality of voltage follower outputs and to the first and second capacitors and is deployed for reducing the phase noise level of the output signals.

31. The apparatus of claim 30, wherein the small logic inputs are emitter-coupled logic (ECL) inputs.

32. The apparatus of claim 30, wherein the input taking circuit includes first and second input taking circuits;

the voltage follower circuit includes first and second voltage follower circuits; and the output circuit includes first and second output circuits.

33. The apparatus of claim 32, wherein the switching circuit comprises:

a first switching circuit coupled to the first voltage follower and the first output circuit; and a second switching circuit coupled to the second voltage follower and the second output circuit.

34. The apparatus of claim 33, wherein the first switching circuit comprises:

a first sub-circuit connected to a first output of the voltage follower outputs of the first voltage follower circuit and coupled to a first current source; and a second sub-circuit connected to a second output of the voltage follower outputs of the first voltage follower outputs and coupled to a second current source, wherein the first and second sub-circuits are coupled to each other.

35. The apparatus according to claim 34, wherein the first sub-circuit comprises:

a first p-channel metal oxide semiconductor (PMOS) transistor having its drain coupled to the first output of the first voltage follower circuit and its source coupled to the first current source and the first capacitor.

36. The apparatus according to claim 35, wherein the second sub-circuit comprises:

a second PMOS transistor having its drain coupled to the second output of the first voltage follower circuit and its source coupled to the second current source and the second capacitor, wherein the first PMOS transistor has its gate connected to the drain of the second PMOS transistor and the second PMOS transistor has its gate connected to the drain of the first PMOS transistor.

37. The apparatus according to claim 36, wherein:

the first capacitor corresponds to a first n-channel metal oxide semiconductor (NMOS) transistor having its gate connected to the source of the first PMOS transistor and its source and drain terminals connected to each other; and the second capacitor corresponds to a second NMOS transistor having its gate connected to the source of the second PMOS transistor and its source and drain terminals connected to each other.

38. The apparatus according to claim 36, wherein the second terminals of the first and second capacitors are tied to a negative rail.

39. The apparatus according to claim 33, wherein the second switching circuit comprises:
a third sub-circuit connected to a first output of the second voltage follower circuit and coupled to a third current source; and
a fourth sub-circuit connected to a second output of the second voltage follower circuit and coupled to a fourth current source, wherein
the third and fourth sub-circuits are coupled to each other.

40. The apparatus according to claim 39, wherein the third sub-circuit comprises:
a third NMOS transistor having its drain coupled to the first output of the second voltage follower circuit and its source coupled to the third current source and a third capacitor.

41. The apparatus according to claim 39, wherein the fourth sub-circuit comprises:
a fourth NMOS transistor having its drain coupled to the second output of the second voltage follower circuit and its source coupled to a fourth current source and a fourth capacitor, and the third NMOS transistor having its gate connected to the drain of the fourth NMOS transistor and the fourth NMOS transistor having its gate connected to the drain of the third NMOS transistor.

42. The apparatus according to claim 41, wherein:
the third capacitor corresponds to a third PMOS transistor having its gate connected to the source of the third NMOS transistor and its source and drain terminals connected to each other; and
the fourth capacitor corresponds to a fourth PMOS transistor having its gate connected to the source of the fourth NMOS transistor and its source and drain terminals connected to each other.

43. The apparatus according to claim 41, wherein the second terminals of the third and fourth capacitors are tied to a positive rail.

44. An apparatus for a CMOS clock driver, comprising:
an input taking circuit for receiving small-signal logic inputs;
a voltage follower circuit coupled to the first input taking circuit for generating a voltage follower output;
an output circuit coupled to the voltage follower circuit for receiving the voltage follower output as an inputs and generating an output signal;
a switching circuit to which the voltage follower circuit is coupled; and
at least one capacitor comprising one or more charge reservoirs; wherein
the switching circuit is coupled to voltage follower output and to the at least one capacitor and is deployed for reducing the phase noise level of the output signal.

* * * * *

UNITED STATES PATENT AND TRADEMARK OFFICE
CERTIFICATE OF CORRECTION

| | | |
|---|---|---|
| PATENT NO. | : 7,969,189 B2 | |
| APPLICATION NO. | : 12/624854 | |
| DATED | : June 28, 2011 | |
| INVENTOR(S) | : Joseph G. Petrofsky | |

It is certified that error appears in the above-identified patent and that said Letters Patent is hereby corrected as shown below:

Specifically, in Column 14, line 25 (Claim 5) it reads -- The apparatus according to claim, ... but should read -- The apparatus according to claim 4, --

Signed and Sealed this
Twenty-second Day of November, 2011

David J. Kappos
*Director of the United States Patent and Trademark Office*